United States Patent [19]

Zejda et al.

[11] Patent Number: 5,538,560
[45] Date of Patent: Jul. 23, 1996

[54] VACUUM COATING APPARATUS

[75] Inventors: Jaroslav Zejda, Rodenbach; Jürgen Henrich, Limeshain, both of Germany

[73] Assignee: Leybold Aktiengesellschaft, Hanau, Germany

[21] Appl. No.: 280,310

[22] Filed: Jul. 26, 1994

[30] Foreign Application Priority Data

Dec. 7, 1993 [DE] Germany .......................... 43 41 635.7

[51] Int. Cl.⁶ .......................... C23C 16/00; C23C 14/00; B05C 13/02; B23Q 1/25
[52] U.S. Cl. .......................... 118/730; 118/733; 118/207; 118/319; 118/500; 118/693; 204/298.23; 204/298.25; 204/298.26; 204/298.27; 204/298.28; 204/297 W; 269/57; 269/71; 269/287
[58] Field of Search .......................... 118/50, 300, 301, 118/319, 500, 504, 693, 207, 209, 230, 721, 723 MR, 728–731, 733; 204/297 R, 297 W, 298.23, 298.25, 298.26, 298.27, 298.28, 298.29; 269/57, 71, 287

[56] References Cited

U.S. PATENT DOCUMENTS

| | | | |
|---|---|---|---|
| 3,856,654 | 12/1974 | George | 204/298 |
| 3,915,117 | 10/1975 | Schertler | 118/49 |
| 4,410,407 | 10/1983 | Macaulay | 204/192.25 |
| 4,588,343 | 5/1986 | Garrett | 204/298.25 X |
| 4,861,565 | 8/1989 | Shekerjian et al. | 422/186.05 |
| 5,183,547 | 2/1993 | Ikeda | 204/298.25 |
| 5,259,942 | 11/1993 | Kempf | 204/298.25 |
| 5,372,693 | 12/1994 | Brauer et al. | 204/298.11 |

Primary Examiner—Robert J. Warden
Assistant Examiner—Christopher Y. Kim
Attorney, Agent, or Firm—Felfe & Lynch

[57] ABSTRACT

A closed cylindrical housing defining a transport chamber has a top plate with a first opening communicating with an entry and exit chamber, and a second opening communicating with a coating chamber. A turntable rotatable about an axis in the transport chamber carries a holder to a first position below the first opening as it carries a like holder to a second position below the second opening. Each holder has thereon a container with a diameter smaller than the first opening but larger than the second opening. A first lifter raises a holder sealingly against the top plate around the first opening, the container thereon passing through the first opening to load or unload substrates. A second lifter raises the other holder so that the container thereon abuts a mask defining the second opening in order to coat a substrate in the container.

3 Claims, 1 Drawing Sheet

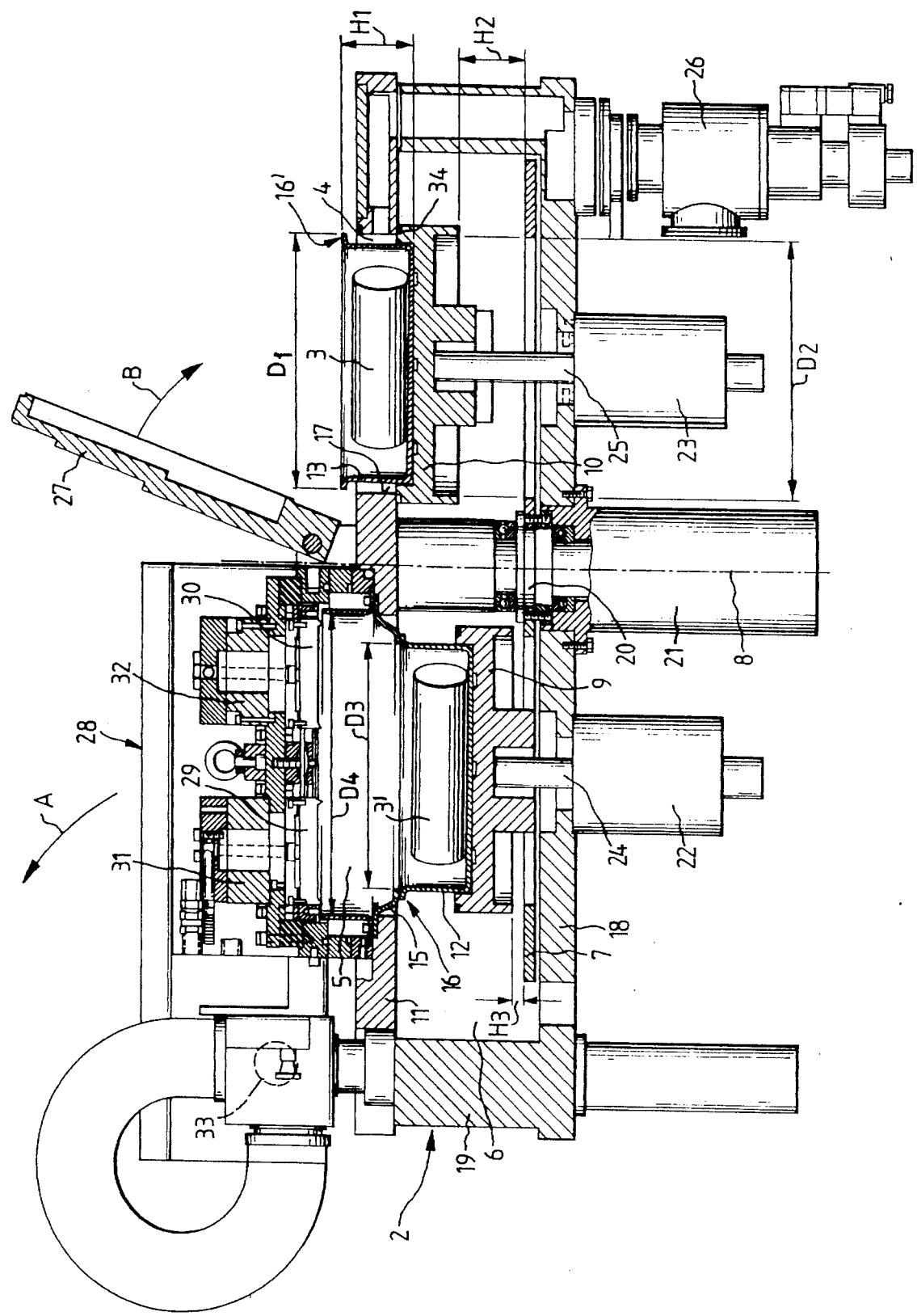

VACUUM COATING APPARATUS

BACKGROUND OF THE INVENTION

The invention relates to a vacuum coating apparatus for applying thin coatings to substrates, having an entry chamber, at least one additional chamber for treating the substrates, and an exit chamber. A conveyor system disposed in an evacuable transport chamber carries the substrates through the chambers, the conveyor system being disposed around a common axis and holders which can turn about the latter. In at least two positions, namely an entry and exit position, the holders each perform a lifting movement with respect to the transport chamber wall, this lifting movement being such that in a first position the holder in a raised position closes the opening of the exit chamber in the wall of the transport chamber.

A disadvantage of known apparatus lies in its complex and expensive construction, and often also in the fact that they can be used only for a very specific substrate. Letting the substrates enter and exit through airlocks has resulted in often difficult sealing problems which have been solved by complex and expensive airlock designs.

U.S. Pat. No. 3,856,654 discloses a vacuum coating apparatus of the kind described above, in which the conveyor system has pot-like frames disposed about an axis of rotation, for the accommodation of substrates to be coated. In one treatment position, namely in the airlock entry and exit position, such a frame is itself part of the wall of the entry and exit chamber, and a movable valve plate is provided for shutting off one end face of the one part of the entry and exit chamber. In this known vacuum coating apparatus the passage through the airlocks of the goods to be coated is given a mechanically simple solution. However, the further movement of the substrates, especially to the position for coating, is complicated. The pot-like frame containing the substrate is brought by the further turning of the conveyor system to a transfer position from which the individual substrates are lifted from the pot-like frame by a lifting means acting on them from below and they are raised upward into the actual vapor coating chamber. The result is not only considerable mechanical complexity, but also complicated and time-consuming operation.

U.S. Pat. No. 3,915,717 discloses a vacuum coating apparatus for applying thin coatings to substrates, which has an entry chamber, additional chambers for the treatment and coating of substrates, and a conveyor system disposed in an evacuable main chamber for carrying the substrates through the chambers. Sealing systems for temporary sealing between the said chambers and the main chamber are provided, and the conveyor system has frames disposed about a common axis and rotatable about the latter for accommodating the substrates to be coated. In at least two treatment positions, namely an entry and exit position and a vapor depositing position, this frame itself forms part of the wall of a treatment chamber, namely the entry and exit chambers and a coating chamber. In at least one of these treatment positions a movable valve plate is provided for closing off one face end of the one portion of the frame that forms the treatment chamber.

The present invention is addressed to the problem of creating an apparatus of the type in question, in which the substrates will be disposed in special containers which can be passed together with the substrates through airlocks into the apparatus, and which will prevent contamination of the interior and of the conveying means due to the coating process. The apparatus is furthermore to be configured so that containers of different sizes can be used.

This problem is solved according to the invention in that a pot-like container to accommodate a substrate can be placed on each holder, and the outside diameter of each container is smaller than the inside diameter of the entry and exit openings, and the height of each container corresponds at least to the total lift height of the holders, and the holder lifts up the container at the treatment position to such a level that the upper margin of the container is applied sealingly to the margin of the opening to the treatment chamber or to a collar or mask inserted into the opening and narrowing the latter, the diameter of the opening determined by the opening in the wall or by the collar or by the mask being smaller than the outside diameter of the upper margin of the container.

BRIEF DESCRIPTION OF THE DRAWING

The sole FIGURE is a diagrammatic longitudinal section through the apparatus.

DETAILED DESCRIPTION OF THE PREFERRED EMBODIMENT

The apparatus includes a substantially circular-cylindrical housing 2 with a plate 11 closing off the top side, a floor portion 18, and a cylindrical lateral wall 19, the housing being evacuated by a vacuum pump 26. A motor 21 drives turntable 7 via shaft 20, and the two lift motors 22 and 23 fastened to the floor portion 18 drive plungers 24 and 25 vertically to raise or lower the holders 9 and 10 disposed on the carrier system 7. Two pot-like containers 12 and 13 lying on the holders 9 and 10 accommodate the substrates 3, and a closing plate 27 hinged on the top plate 11 permits loading and unloading substrates. A cathode system 28 with the corresponding targets 29 and 30 and magnet systems 31 and 32 are mounted for rotation on a pin 33 in arrow direction A, which permits access to the targets 29 and 30 and to the treatment chamber 5.

The FIGURE shows the apparatus with the plate 27 open and with the substrate 3 placed in the pot-like container 13. The lift motor 23 has lifted the holder 10 by means of the plunger 25 to such a point that the holder 10 comes into tight contact with its gasket 34 against the bottom of the top plate 11 of the transport chamber 6 and closes the opening 17. At the same time the lift motor 22 has raised holder 9 with its plunger 24 by the amount $H_3$ until the circumferential upper edge 16 of the pot-like container 12 contacts the mask 15, so that the bottom of treatment chamber 5 is completely closed off. The diameter $D_4$ of the opening in the top plate 11 (without mask 15) is greater than the diameter $D_1$ of the pot-like containers 12 and 13.

In the phase of the coating process represented in the drawing, the substrate 3 in container 13 is in the airlock entry position and the substrate 3' in container 12 is in the treatment or coating position. At the end of the coating process performed by means of the cathode system 28, the closing plate 27 closes chamber 4 and the holder 10 moves downward by the amount $H_2$ until the upper circumferential edge 16' of the pot-like container 13 is below the bottom of the top plate 11. At the same time the holder 9 is lowered by the amount $H_3$. Then the carrier system 7 is rotated 180 degrees, so that the container 12 with the substrate 3' is in the position beneath the chamber 4, and the substrate together with the container 13 and the holder 10 is beneath the treatment chamber 5. Both lift motors 22 and 23 are now activated, so that the containers 12 and 13 are lifted up, so that after the closing plate 27 opens the substrate 3' can be removed from the container 12 and the substrate 3 can be coated by the cathode 28. From this point on, the operations described above are repeated, so that after the substrate 3' has been removed from the airlock another substrate can be loaded, transported and coated.

It is clear that the lift height $H_2$ of the plunger 25 has to be such that the container 13 can be lowered until its upper edge 16' is below the bottom surface of the top plate 11, and on the other hand can be raised until the container can be conveniently lifted out (with plate 27 open). It is also clear that the lift $H_3$ of plunger 24 must be sufficient so that the upper margin 16 of container 12 can be raised against mask 15 to shut off the opening between the treatment chamber 5 and the transport chamber 6, and on the other hand can be lowered so that an annular gap can form between its upper edge 16 and the bottom of mask 15 to permit container 12 to be carried from the treatment position to the airlock entry/exit position.

What is claimed is:

1. Vacuum coating apparatus for applying; a thin coating to a plurality of substrates, said apparatus comprising an entry chamber where substrates are loaded;

a treatment chamber where said substrate are coated, a closed cylindrical housing defining a transport chamber and having a top plate with a first opening of diameter $D_2$ communicating with said entry chamber and a second opening of diameter $D_3$ communicating with said treatment chamber, carrier means rotatable about an axis in said treatment chamber, said carrier means comprising a pair of holders movable from a first position below said first opening to a second position below said opening, said holders having a diameter which is larger than the diameter $D_2$ of said first opening, a container of diameter $D_1$ on each of said holders, where $D_1$ is smaller than $D_2$ of the first opening but larger than diameter $D_3$ of the second opening, each said container being dimensioned to accommodate at least one substrate and being readily removable from the respective holder, first lifting means for lifting one of said holders vertically from said first position to a loading position where the container thereon passes through said first opening and said holder abuts said top plate around said first opening, whereby said container can be removed from said one of said holders; and second lifting means for lifting one of said holders vertically from said second position to a coating position where the container thereon abuts said top plate around said second opening.

2. Vacuum coating apparatus as in claims 1 wherein said top plate comprises a mask which defines said second opening.

3. Vacuum coating apparatus as in claim 1 further comprising a closing plate movable sealingly against said top plate over said first opening, said closing plate being profiled to accommodate said container when said holder is in said loading position.

* * * * *